US009209773B1

(12) United States Patent
Arlin et al.

(10) Patent No.: US 9,209,773 B1
(45) Date of Patent: Dec. 8, 2015

(54) RF/MICROWAVE PRESSURE CONTACT INTERFACE

(71) Applicant: Lockheed Martin Corporation, Grand Prairie, TX (US)

(72) Inventors: Steven H. Arlin, Chelmsford, MA (US); Raymond J. Chagnon, Salem, NH (US); Ronald L. Squillacioti, Chelmsford, MA (US)

(73) Assignee: Lockheed Martin Corporation, Grand Prairie, TX (US)

( * ) Notice: Subject to any disclaimer, the term of this patent is extended or adjusted under 35 U.S.C. 154(b) by 269 days.

(21) Appl. No.: 13/739,902

(22) Filed: Jan. 11, 2013

Related U.S. Application Data

(60) Provisional application No. 61/585,438, filed on Jan. 11, 2012.

(51) Int. Cl.
*H03H 7/38* (2006.01)

(52) U.S. Cl.
CPC ..................... *H03H 7/38* (2013.01)

(58) Field of Classification Search
CPC ..................... H03H 7/38; H01P 3/00
USPC ............................................. 333/33
See application file for complete search history.

(56) References Cited

U.S. PATENT DOCUMENTS 5,552,752 A * 9/1996 Sturdivant et al. ............ 333/243
6,974,915 B2 * 12/2005 Brodsky et al. ............... 174/260

OTHER PUBLICATIONS

Shinde, Darshan U., "Wear Simulation of Electrical Contacts Subjected to Vibrations," A Thesis Submitted to the Graduate Faculty of Auburn University in Partial Fulfillment of the Requirement for the Degree of Master of Science, Auburn, Alabama, Aug. 9, 2008, 139 pages.

* cited by examiner

*Primary Examiner* — Sibin Chen
*Assistant Examiner* — Metasebia Retebo
(74) *Attorney, Agent, or Firm* — Withrow & Terranova, PLLC

(57) ABSTRACT

A controlled impedance microwave surface to surface interface utilizes compression contact technologies.

13 Claims, 2 Drawing Sheets

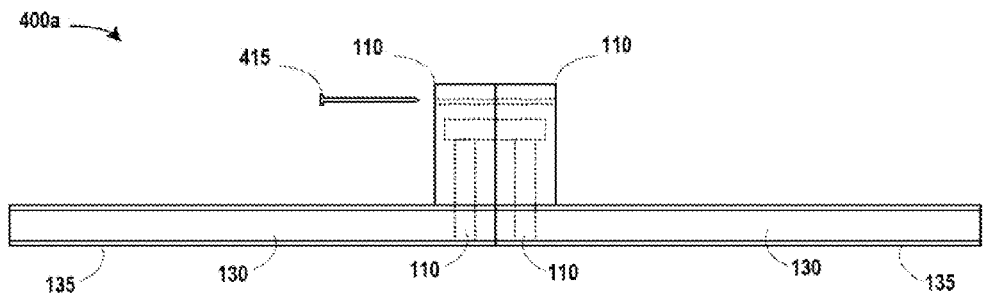
FIG. 4
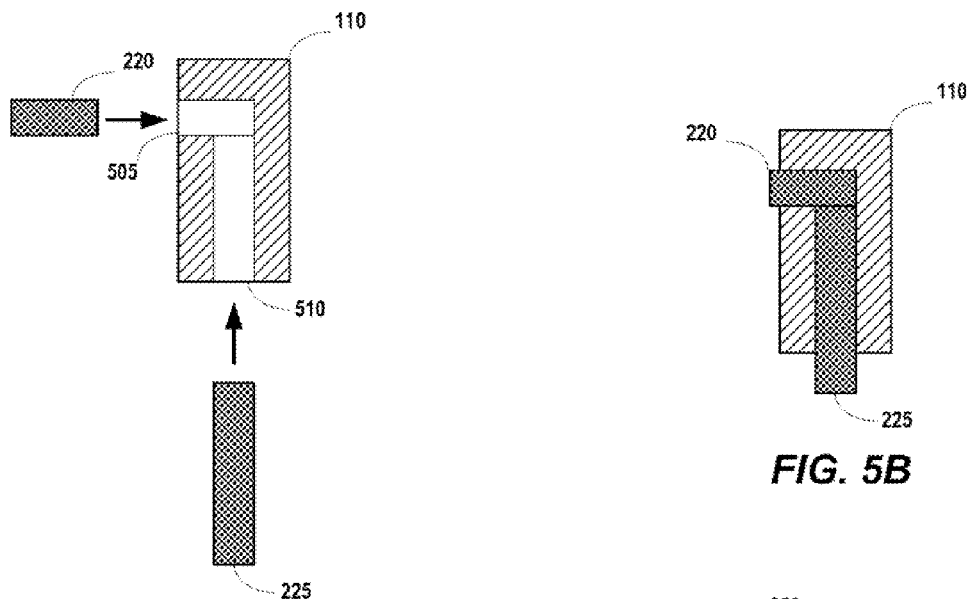
FIG. 5A
FIG. 5B
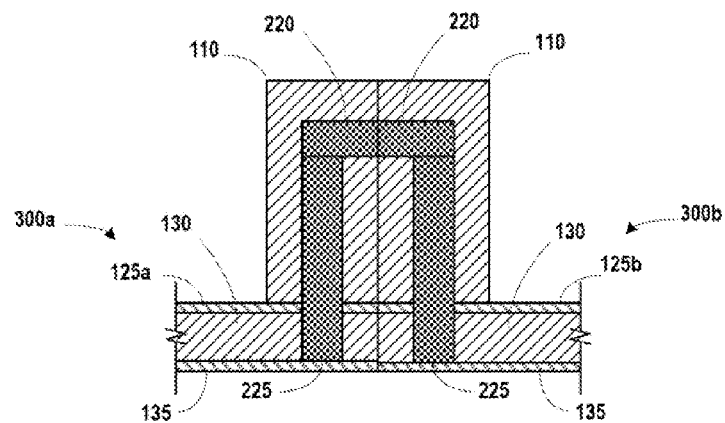
FIG. 5C

RF/MICROWAVE PRESSURE CONTACT INTERFACE

CROSS-REFERENCE TO RELATED APPLICATIONS

The priority to U.S. application Ser. No. 61/585,438, entitled, "RF/Microwave Pressure Contact Interface with Ground-Signal-Ground" filed Jan. 11, 2012, in the name of the inventors Steven H. Arlin, Raymond J. Chagnon, and Ronald L. Squillacioti is hereby claimed pursuant to 35 U.S.C. §119(e). This application is also hereby incorporated by reference for all purposes as if set forth herein verbatim.

STATEMENT REGARDING FEDERALLY SPONSORED RESEARCH OR DEVELOPMENT

Not applicable.

BACKGROUND

This section of this document introduces information about and/or from the art that may provide context for or be related to the subject matter described herein and/or claimed below. It provides background information to facilitate a better understanding of the various aspects of the presently claimed subject matter. This is a discussion of "related" art. That such art is related in no way implies that it is also "prior" art. The related art may or may not be prior art. The discussion in this section of this document is to be read in this light, and not as admissions of prior art.

For some applications, there is a need for very small RF connectors and cable interfaces in small part minimized circuits and modules where space and/or weight is limited. Typically, the designer is at the mercy of the available off the shelf or customized coaxial connectors and cable assemblies. The selection of available interfacing technologies for the RF frequency spectrum is a limiting factor in cases where the requirements for size, weight and minimization of parts is key.

The present invention is directed to resolving, or at least reducing, one or all of the problems mentioned above.

SUMMARY

In a first aspect, a controlled impedance microwave surface to surface interface utilizes compression contact technologies configured to interconnect a first microwave circuit and a second microwave circuit at a controlled microwave impedance.

In a second aspect, an apparatus, comprises: a planar microwave circuit; and means for compressively and electrically connecting at a controlled microwave impedance the planar microwave circuit to another microwave circuit.

In a third aspect, an apparatus, comprises: a planar microwave circuit; an interposer secured to the planar microwave circuit; and a plurality of compression contacts disposed within the interposer in a controlled microwave impedance ground-signal-ground configuration in electrical contact on one end thereof with the planar microwave circuit and exposed for electrical connection on the other end thereof.

The above presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

BRIEF DESCRIPTION OF THE DRAWINGS

The invention may be understood by reference to the following description taken in conjunction with the accompanying drawings, in which like reference numerals identify like elements, and in which:

FIG. 4 illustrates a connection between two interfaces first shown in FIG. 1.

FIG. 5A-FIG. 5C further illustrate the manufacture of the embodiment of FIG. 1 in the context of an assembly such as that shown in FIG. 4.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
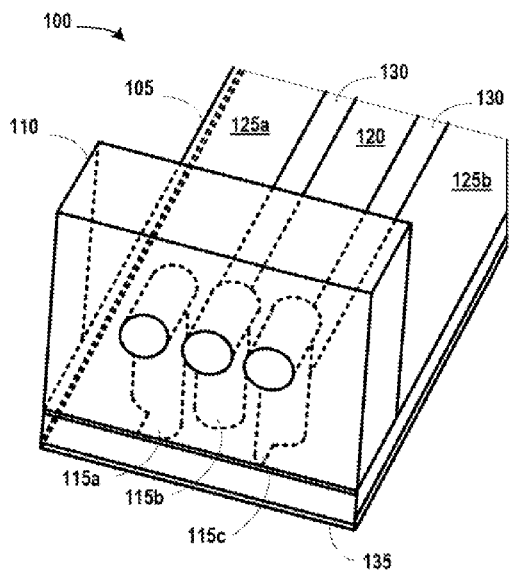
FIG. 1 is a partial, perspective view of one embodiment of an interface constructed and operated in accordance with the principles disclosed herein.

The problems associated with small connectors and interfaces were addressed by creating a ground-signal-ground connection using gold plated "springy" metal contacts supported by a non-conductive dielectric structure. The term "springy" in this contest means that the contacts are flexible in their structure so as to permit relative movement while making the electrical connection. FIG. 1 is a partial, perspective view of one embodiment 100 of an interface constructed and operated in accordance with the principles disclosed herein. The apparatus 100 comprises a planar microwave circuit 105, and interposer 110, and a plurality of contacts 115a-115c.

Figure 3:
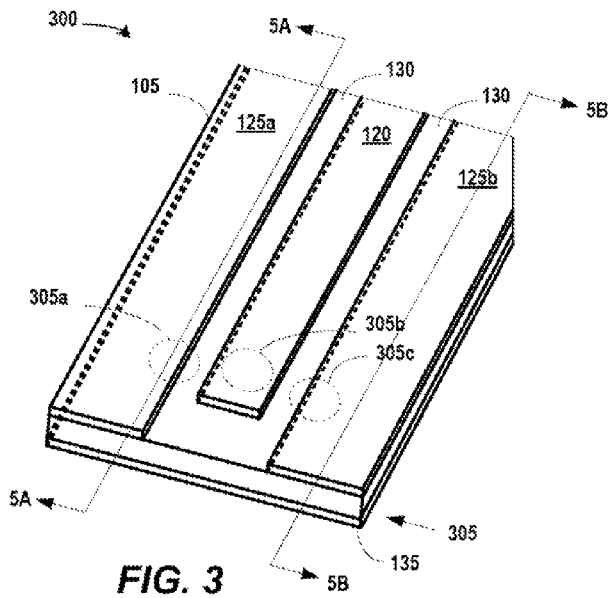
FIG. 3 depicts the planar microwave circuit of the embodiment of FIG. 1.

The planar microwave circuit 105, shown best in FIG. 3, comprises a signal line 120 flanked by two ground lines 125a, 125b, all of which are coplanar and formed in a microwave laminate substrate 130. The materials may be chosen from conventional materials known to the art. For example, usually the metals are Copper (Cu), which is chosen for its superior electrical and thermal conductivity properties. Also, there is a layer of gold plating or solder plating (not shown) to minimize the effects of oxidation of the copper and provide a compatible interface for the attachment of components. The microwave laminate substrate 130 is fabricated from Rogers 4350B, a commonly known material for this purpose available off the shelf from Rogers Corporation by phone (972-226-0141), fax (972-226-0141) and Internet (http://www.rogerscorp.com/acm/index.aspx).

Note that, in the illustrated embodiment, the signal line 120 stops well before the end 305 of the board 300 as is best shown in FIG. 3. The board 300 is, in this embodiment, a printed wired board, or "PWB". Extending the signal line 120 to the edge 305 would add an electric stub to the 50 ohm line, causing a mismatch, in this particular embodiment. These types of design considerations are well known in the art and may vary in alternative embodiments based on implementation specific design considerations.

The presently disclosed technique permits wide latitude in materials selection for the planar microwave circuit 105 and virtually an suitable material known to the art may be used in various embodiments. The materials nevertheless form a part of the controlled impedance environment for the signal. Materials choices will therefore affect other design choices in a manner that will become apparent to those skilled in the art having the benefit of this disclosure.

The planar microwave circuit 105 may be fabricated using techniques well known to the art. For example, the process may start with the microwave laminate substrate 130 sandwiched between two metallized layers. One metallized layer, frequently referred to as the "bottom" layer, is left more or less intact to serve as the ground plane. The other metallized layer can then be processed to create the features of the planar microwave circuit 105. For example, in the illustrated embodiment, portions of the metallized layer have been removed to expose the microwave laminate substrate 130 as shown in FIG. 1 and FIG. 3, thereby defining the signal line 120 and the ground lines 125a, 125b. Those in the art will appreciate that fabrication techniques well known in the art, such as the use of "vias" (not shown), may be used to establish electrical connections between, for example, the ground lines 125a, 125b and the grounded backplane 135.

The interposer 110 supports the contacts 115a-115c and may be secured to the planar microwave circuit 105 in any suitable manner known to the art, e.g., fastening, adhering, bonding, etc. It should be fabricated from the non-conductive material whose dielectric constant is stable over a wide range of relevant frequencies. It should be formable in order to be fabricated, but it should be stable at high temperatures so that it does not deform in use.

In the illustrated embodiment, this material is Ultem1000. This material is a thermoplastic polyetherimide high heat polymer designed by General Electric for injection molding processing. It is also well known in the art and commercially available off the shelf. This material is available from a large number of well known vendors readily located through industry connections or the Internet. Similarly, techniques for working with such a material to fabricate, for example, the interposer 110 are also well known in the art.

The presently disclosed technique permits wide latitude in materials selection for the interposer 110 and virtually any suitable material known to the art may be used in various embodiments. The materials nevertheless form a part of the controlled impedance environment for the signal. Materials choices will therefore affect other design choices in a manner that will become apparent to those skilled in the art having the benefit of this disclosure.

Figure 2A:
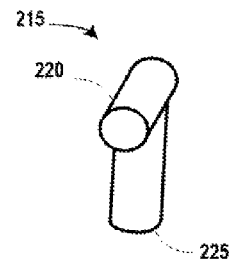
FIG. 2A-FIG. 2C depict the springy metal contacts of the embodiment in FIG. 1 in isometric, front plan, and side plan views.
Figure 2B:
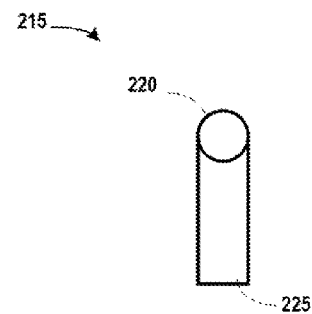
Figure 2C:
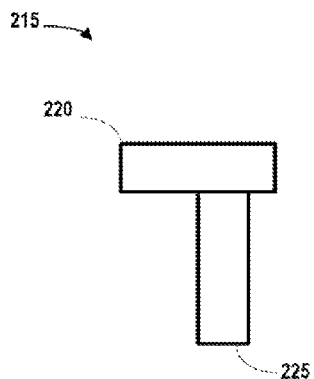

In the illustrated embodiment, the contacts 115a-115c are arranged in a configuration that has been optimized for a 50Ω impedance and provides a low insertion loss and low reflection coefficient. An exemplary contact 215 is shown in FIG. 2A-FIG. 2C and comprises a contact structure 220 and a support 225. The contacts with the supporting structure can be oriented in a linear ("straight thru") configuration, or a right angle configuration. In such a right angle configuration, the extension of 220 beyond 225 and deviations from a smooth right angle should be minimal. The illustrated embodiment employs a right angle configuration. This is an innovative method of making a high performance connection between microwave and RF circuits without the traditional coaxial connectors/cables. The technique allows for module to module connections where space is at a premium.

The G-S-G right angle contact design provides for maintaining good transmission line parameters throughout the transition. The "right-angle" configuration of the contacts provides a change in plane of the signal path required to interface to an adjacent stage. The contacts are arranged in a Ground-Signal-Ground (G-S-G) configuration which interfaces with coplanar waveguide micro-strip transmission lines. Note that although the illustrated embodiments are a G-S-G configuration, the presently disclosed technique is not necessarily limited to G-S-G configurations.

The interface design in the illustrated embodiment utilizes various "Fuzz Button" style contacts which provide the physically compliant, low resistance connection. Fuzz Buttons® are a trademarked, proprietary high performance contact structure available only from Custom Interconnects. They are available off the shelf at: Custom Interconnects, LLC; 2055 S. Raritan Street, Unit A; Denver, Colo. 80223; phone: 303.934.6600; fax: 303.934.6606; email: sales@custominterconnects.com; Internet: http:/custominterconnects.com/index.html.

Fuzz Buttons® are contacts comprised of shaped, spun, gold-plated metal fibers. They have a consistency and structure somewhat like balls of cotton, which are spun cotton fibers. The spun-fiber nature of the structure permits compression and imparts the springy characteristic mentioned above. That is, it makes the contacts flexible in their structure so as to permit relative movement while making the electrical connection. It also actually provides multiple contacts allowing for some connections to open while others are close and able to continue the electric connections. The compressive nature of the contacts also allows movement of the parts due to temperature and vibration while holding the electrical contact.

Alternative embodiments may employ alternative compression contact technologies. For example, appropriately shaped spring loaded fingers may be used in some alternative embodiments. In this context, "spring loaded" means that the fingers are "springy" in the sense that they will "spring" back to their original position when a deforming force is removed. Thus, the contacts are flexible in their structure so as to permit relative movement while making the electrical connection. Still other alternatives will become apparent to those skilled in the art having the benefit of this disclosure.

The contacts are chosen with consideration for the microstrip line, co-planar gap spacing and compression contact availability as the design parameters. The diameters of the contacts are commensurate with the geometries required to maintain the required impedance, and the lengths are only as long as necessary without overlaps at the right angle. It is desirable to minimize overlaps to minimize the stub effect the generate, which can cause discontinuity in the RF response.

The apparatus 100 can be connected to transmit the signal by abutting the interposer 110 to the surface of another structure, aligning the contacts 115a-115c, and then securing the interposer 110 to the other structure as shown in FIG. 4. The other structure may be, for example, a housing or a PCB through which the signal is to be transmitted or the interposer of another similarly constructed apparatus. This eliminates various types of connectors and cabling through which such connections are presently made. The interposer 110 may be secured in this way in any suitable manner known to the art, e.g., fastening, adhering, bonding, etc.

In the embodiment of FIG. 4, the "other structure" is the interposer of another similarly constructed apparatus. Thus, in FIG. 4, two apparatuses 400a, 400b are mated together through their respective interposers 110. Note that the contacts 115 are aligned and contacting and that those in the foreground extend through the microwave laminate substrate 130 to the ground plane 135. The two apparatuses 400a, 400b are fastened together using a plurality of fasteners 410 (only one shown). Those in the art will appreciate that the interface is a blind-mate interface. It is also a surface to surface interface.

Turning now to FIG. 5A-FIG. 5C, the manufacture and construction of the embodiment of FIG. 4 is illustrated further. FIG. 5A-FIG. 5B as sectioned views of the interposer 110. The interposer 110 is first cast and then the bores 505, 510 are milled therein. The contact structure 220 and support 225 are then inserted into the bores 505, 510 as indicated in FIG. 5A. Note how, in FIG. 5B, the contact 220 pin and support 225 extend beyond the bores 505, 510. This is repeated for each of the contacts 115a-115c.

The interposer 110 with the inserted contact structure 220 and support 225 are then mated to the board 300. The broken circles 305a-305c in FIG. 3 show the point of contact for the contacts 115a-115c on the board 300. As indicated above, the interposer 110 may attached to the board 300 in any suitable manner to the art that ensures a stable and durable attachment. Note that the circles 305a, 305c indicate the point at which the vias may be fabricated so that the contacts 115a, 115c extend through to the ground plane 135.

The affixation of the interposer 110 to the board 300 will compress the supports 225 of the contacts 115a-115c within the bores 505, 510. The springy nature of the supports 225 will ensure that an electrical connection is made between the contacts 115a, 115c and the ground plane 135 and between the contact 115b and the signal line 120 by urging the ends of the supports 225 against the ground plane 135 and the signal line 120.

This is shown in FIG. 5C. In FIG. 5C, two separate assemblies mated together as shown in FIG. 4 are illustrated in a partial sectional view. (The fastener is omitted for the sake of clarity.) The assembly on the left is sectioned along line 5A-5A in FIG. 3. The right hand assembly is sectioned along line 5B-5B in FIG. 3. Note how the supports 225 extend through the unreferenced vias to contact the ground plane 135.

The mating of the two interposers 110 also compresses the contact structures 220 of the contacts 115a-115c into the bores 220. The springy nature of the contact structures 220 causes them to resist the deformation and thereby maintain the electrical connections between the two sets of contacts 115a-115c. Note how in both the case of the contact structures 220 and the supports 225 that this resistance to deformation renders them flexible in their structure so as to permit relative movement while making the electrical connection.

The presently disclosed technique facilitates connecting/interfacing RF and microwave signals from module to module, printed circuit board ("PCB") to PCB, module to antenna, etc. The interface can be designed to very small dimensions (needs to be accounted for at early design stages). It is particularly useful for space constrained RF interfaces where there is little or no room for a traditional coaxial RF connector and cable. It also addresses vibration and shock performance issues related to rigid connections and multiple mechanical parts. Furthermore, it provides a relatively low reflection coefficient and low insertion loss (i.e., high RF performance) means of transitioning to another circuit or function at RF/microwave frequencies. It provides a reliable, physically compliant connection using pressure sensitive contacts. Not all embodiments will necessarily exhibit all these characteristics and, among those that they do, the will not all manifest them to the same extent.

Should any incorporated reference conflict with disclosure set forth herein within the four corners of this document, the present disclosure controls the conflict.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A controlled impedance microwave surface to surface interface comprising:
   an interposer comprising:
      a dielectric structure having a first surface and a second surface that is substantially perpendicular with respect to the first surface, wherein the dielectric structure forms a contact bore that extends from the first surface into the dielectric structure, and forms a support bore that extends from the second surface into the dielectric structure to the contact bore such that the contact bore and the support bore collectively form a through-hole through the dielectric structure from the first surface to the second surface;
      a contact structure disposed in the contact bore having a first exposed end that extends beyond the first surface, wherein the contact structure comprises a compressible conductive material; and
      a support structure disposed in the support bore having a second exposed end that extends beyond the second surface and which contacts the contact structure, wherein the support structure comprises the compressible conductive material,
      wherein the second exposed end is configured to fit within an opening formed in a substrate of a first microwave circuit and contact a conductive plane of the first microwave circuit.

2. The controlled impedance microwave surface to surface interface of claim 1, wherein the compressible conductive material comprises spun metal fibers.

3. The controlled impedance microwave surface to surface interface of claim 1, wherein the dielectric structure forms a second contact bore that extends from the first surface into the dielectric structure, and forms a second support bore that extends from the second surface into the dielectric structure to the second contact bore such that the second contact bore and the second support bore collectively form a second through-hole through the dielectric structure from the first surface to the second surface, and wherein the interposer further comprises:

a second contact structure disposed in the second contact bore having a first exposed end that extends beyond the first surface, wherein the second contact structure comprises the compressible conductive material; and a second support structure disposed in the second support bore having a second exposed end that extends beyond the second surface and which contacts the second contact structure, wherein the second support structure comprises the compressible conductive material, wherein the second exposed end of the second support structure is configured to fit within a second opening formed in the substrate of the first microwave circuit and contact a second conductive plane of the first microwave circuit.

4. The controlled impedance microwave surface to surface interface of claim 1, further comprising a blind-mate interface on at least one of the first surface and the second surface.

5. The controlled impedance microwave surface to surface interface of claim 1, wherein the interface is configured in a ground-signal-ground format.

6. The controlled impedance microwave surface to surface interface of claim 1, further comprising:
a second interposer configured to:
attach to a second microwave circuit;
attach to the first interposer; and
interconnect the conductive plane of the first microwave circuit to a conductive plane of the second microwave circuit.

7. The controlled impedance microwave surface to surface interface of claim 6, wherein the second interposer comprises:
a second dielectric structure having a third surface and a fourth surface that is substantially perpendicular with respect to the third surface, wherein the second dielectric structure forms a second contact bore that extends from the third surface into the second dielectric structure, and forms a second support bore that extends from the fourth surface into the second dielectric structure to the second contact bore such that the second contact bore and the second support bore collectively form a second through-hole through the second dielectric structure from the third surface to the fourth surface;

a second contact structure disposed in the second contact bore having a third exposed end that extends beyond the third surface, wherein the second contact structure comprises the compressible conductive material; and a second support structure disposed in the second support bore having a fourth exposed end that extends beyond the fourth surface of the second interposer and which contacts the second contact structure, wherein the second support structure comprises the compressible conductive material, wherein the fourth exposed end is configured to fit within a second opening formed in a substrate of the second microwave circuit and contact the conductive plane of the first microwave circuit.

8. The controlled impedance microwave surface to surface interface of claim 6, wherein the first interposer and the second interposer are configured to form a controlled impedance between the conductive plane of the first microwave circuit and the conductive plane of the second planar microwave circuit.

9. An apparatus, comprising:
a first planar microwave circuit; and
means for compressively and electrically connecting at a controlled microwave impedance the first planar microwave circuit to a second planar microwave circuit, comprising:
means for electrically isolating a plurality of means for conducting signals, comprising a first surface and a second surface that is substantially perpendicular with respect to the first surface, wherein the means for electrically isolating form a contact bore that extends from the first surface into the means for electrically isolating, and form a support bore that extends from the second surface into the means for electrically isolating to the contact bore such that the contact bore and the support bore collectively form a through-hole through the means for electrically isolating from the first surface to the second surface;
first means for conducting signals from the plurality of means for conducting signals disposed in the contact bore having a first exposed end that extends beyond the first surface; and
second means for conducting signals from the plurality of means for conducting signals disposed within the support bore having a second exposed end that extends beyond the second surface and which contact the first means for electrically conducting signals,
wherein each of the plurality of means for conducting signals comprises a compressible material, and
wherein the second exposed end is configured to fit within an opening formed in a substrate of the first planar microwave circuit and contact a conductive plane of the first planar microwave circuit.

10. The apparatus of claim 9, wherein the means for compressively and electrically connecting further comprises a blind-mate interface on at least one of the first surface and the second surface.

11. The apparatus of claim 9, wherein the means for compressively and electrically connecting further comprises an interface to contact the conductive plane of the first planar microwave circuit, and wherein the means for compressively and electrically connecting is configured in a ground-signal-ground format.

12. The apparatus of claim 9, further comprising:
the second planar microwave circuit; and
second means for compressively and electrically connecting at a controlled microwave impedance the second planar microwave circuit to the first planar microwave circuit, configured to:
attach to the second planar microwave circuit;
attach to the means for compressively and electrically connecting; and
interconnect the conductive plane of the first planar microwave circuit to a conductive plane of the second planar microwave circuit.

13. The apparatus of claim 12, wherein the means for compressively and electrically connecting and the second means for compressively and electrically connecting are configured to form a controlled impedance between the conductive plane of the first planar microwave circuit and the conductive plane of the second planar microwave circuit.

* * * * *